United States Patent
Winkler et al.

(10) Patent No.: US 8,350,465 B2
(45) Date of Patent: Jan. 8, 2013

(54) DOPED GARNET FLUORESCENT SUBSTANCE HAVING RED SHIFT FOR PC LEDS

(75) Inventors: Holger Winkler, Darmstadt (DE); Thomas Juestel, Witten (DE); Julian Plewa, Muenster (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/123,758

(22) PCT Filed: Sep. 2, 2009

(86) PCT No.: PCT/EP2009/006356
§ 371 (c)(1),
(2), (4) Date: Aug. 4, 2011

(87) PCT Pub. No.: WO2010/043287
PCT Pub. Date: Apr. 22, 2010

(65) Prior Publication Data
US 2011/0279022 A1 Nov. 17, 2011

(30) Foreign Application Priority Data

Oct. 13, 2008 (DE) .................. 10 2008 051 029

(51) Int. Cl.
*H05B 33/00* (2006.01)
*H01J 1/62* (2006.01)

(52) U.S. Cl. ... 313/504; 313/512; 313/483; 252/301.4 F

(58) Field of Classification Search .................. 313/484, 313/483, 503, 512; 252/301.4 F, 301.6 F
See application file for complete search history.

(56) References Cited

U.S. PATENT DOCUMENTS

| 4,093,890 A | 6/1978 | Verriet et al. |
| 2005/0099786 A1 | 5/2005 | Liu et al. |
| 2005/0205874 A1 | 9/2005 | Liu et al. |
| 2009/0189507 A1 | 7/2009 | Winkler et al. |

FOREIGN PATENT DOCUMENTS

| DE | 10 2004 051 519 A1 | 5/2005 |
| DE | 10 2007 010 719 A1 | 9/2008 |
| EP | 1 566 426 A2 | 8/2005 |
| GB | 1 533 507 A | 11/1978 |
| WO | WO 2007/144060 A1 | 12/2007 |
| WO | WO 2008/107062 A1 | 9/2008 |

OTHER PUBLICATIONS

International Search Report of PCT/EP2009/006356 (Nov. 12, 2009).
"A Method for Preparing Fluorescent Powder for White Light LED Excited by Blue Light," Application No. 200610173386.1, Application Date Dec. 29, 2006, Inventor Hongpeng You et al.

*Primary Examiner* — Joseph L Williams
(74) *Attorney, Agent, or Firm* — Millen, White, Zelano & Branigan, P.C.

(57) ABSTRACT

The invention relates to phosphors having a garnet structure of the formula I $(Y_a,Lu_b,Se_c,Tb_d,Th_e,Ir_f,Sb_g)_{3-x}(Al_{5-y}Mg_{y/2}Si_{y/2})O_{12}:Ce_x$ (I), where $a+b+c+d+e+f+g+h+i=1$ $x=0.005$ to $0.1$ and $y=0$ to $4.0$, and to a process for the preparation of these phosphors and to the use as conversion phosphors for conversion of the blue or near-UV emission from an LED.

25 Claims, 11 Drawing Sheets

DOPED GARNET FLUORESCENT SUBSTANCE HAVING RED SHIFT FOR PC LEDS

The invention relates to phosphors which consist of garnets co-doped with $Th^{4+}$, $Sb^{3+}$, $Ir^{3+}$ and/or $Se^{3+}$, to the preparation thereof, and to the use thereof as LED conversion phosphor for warm-white LEDs or so-called colour-on-demand applications.

The colour-on-demand concept is taken to mean the production of light having a certain colour point by means of a pcLED (=phosphor converted LED) using one or more phosphors. This concept is used, for example, in order to produce certain corporate designs, for example for illuminated company logos, trademarks, etc.

Since the invention of blue (In,Ga)N light-emitting diodes (LEDs) at the beginning of the 1990s (S. Nakamura, *Appl. Phys. Lett.* 67 (1995) 1868), there have been major efforts worldwide to produce white light sources based on blue InGaN semiconductor chips. To this end, use is made of a luminescent powder layer or a light screen, which is applied directly to the chip and converts some of the blue LED radiation into yellow light. White light is thus formed through additive colour mixing in the LED. White LEDs which are commercially available today comprise virtually exclusively $Y_3Al_5O_{12}$:Ce (YAG:Ce) as yellow phosphor, which is virtually the ideal convertor owing to its high efficiency and stability. Its greatest disadvantage is the lack of a red component in the emission spectrum, meaning that solid-state light sources comprising YAG:Ce today usually only provide cold white colours ($T_c$>5000 K), which restricts their range of applications in general lighting, especially in the interior sector.

The aim of many past investigations was to modify YAG:Ce so that the emission band of the $Ce^{3+}$ activator is shifted into the red spectral region. According to research results from the lighting industry (GE, Philips, Osram, Nichia, Toshiba, Matsushita, Citizen, etc.), it is possible to achieve the requisite red shift through the following measures:

1. Co-doping with the rare earths $Gd^{3+}$, $Tb^{3+}$ or $Dy^{3+}$
2. Partial substitution of the oxide anions by nitride anions at the same time as charge compensation at the cation sites
3. Increase in the $Ce^{3+}$ concentration Unfortunately, these measures reduce the quantum yield of the YAG:Ce phosphor due to concentration or thermal quenching, which is unacceptable for use in a light source since, in the present cases, this also results in a reduction in the phosphor luminance. The phosphor luminance is the essential criterion for use in light sources, since the customer, for defined excitability and defined colour point, makes the choice of phosphor solely on the basis of its luminance. The phosphor price does not play the crucial role since this is negligible compared with the total price for an LED. There therefore continues to be a great demand to find solutions by means of which the emission band of the 5d-4f transition of YAG:Ce can be shifted into the red spectral region without reducing the luminance of the phosphor.

CN 100999662 describes co-doped garnets of the empirical formula $(R_{3-x-y}Ce_xLn_y)A_5O_{12}$, where R denotes at least one element from Pr, Nd, Sm, Dy, Bi, and A denotes at least one element from B, Al, Ga, Si, Mn, Mg, where $0.01>=x<=1.2$ and $0<=y<=0.2$. The materials are calcined in a CO atmosphere from oxides via the solid-state diffusion method (also known as mix & fire) which is known to the person skilled in the art. The CO is prepared by placing a container containing activated carbon around the crucible in which the starting materials are located. On heating, a Boudouard equilibrium forms, causing the formation of a CO gas atmosphere. The materials formed are described in relative brightness values, but this makes it impossible to see how bright these materials actually are. It is evident from a Chinese application that the reduction by means of CO prepared through the Boudouard equilibrium is unfavourable. Apart from the impossibility of setting a CO partial pressure, there is no control of whether the activated carbon is consumed during the calcination process. If this is true, the furnace material is oxidised, meaning that the phosphor properties may be significantly impaired. This method is also unsuitable for continuous production, contrary to the statement in CN 100999662, inter alia owing to the nature of the production of the CO.

Furthermore, WO2008051486 discloses a material $(Y,A)_3(Al,B)_5(O,C)_{12}$:$Ce^{3+}$, where A is an element from Tb, Gd, Sm, La, Sr, Ba, Ca and A substitutes Y to the extent of 0.1 to 100%, where B is an element from Si, Ge, B, P, Ga and B substitutes Al to the extent of 0.1 to 100% and where C is an element from F, Cl, N, S and C substitutes O to the extent of 0.1 to 100%. The phosphor nanoparticles described here, with a size of 200-300 nm, result in lower luminance in an LED than microparticles, which is familiar to the person skilled in the art: in such small particles, a majority of the Ce activators are located at the surface, where these ions are subjected to an inhomogeneous crystal field and unavoidable surface defects result in absorption of the photons to be emitted. Fluorine-containing phosphors cannot be employed in LEDs since fluorine (fluoride) must not be present as a constituent of the ROHS list in electronic components (LEDs). The phosphors described can emit in a range between "540-560" nm. These wavelengths are accessible in a simpler manner by using YAG, LuAG or TAG.

The object of the present invention is therefore to provide conversion phosphors which are red-shifted, i.e. fluoresce in the range 560-605 nm, for white LEDs or for colour-on-demand applications, which do not have one or more of the above-mentioned disadvantages and produce warm-white light. Surprisingly, it has been found that bright and highly efficient YAG:Ce phosphors having a significant red shift can be achieved if some of the $Al^{3+}$ cations are substituted by $Si^{4+}$ and at the same time, for charge compensation, an analogous proportion of the $Al^{3+}$ cations are substituted by $Mg^{2+}$, if one or more elements from the group Se, Th, Ir, Sb are employed as co-dopants. These four co-dopants are preferably each present at least in a concentration of 100 ppm.

The present invention thus relates to phosphors having a garnet structure of the formula I

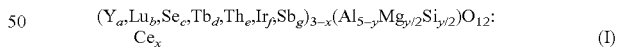

$(Y_a, Lu_b, Se_c, Tb_d, Th_e, Ir_f, Sb_g)_{3-x}(Al_{5-y}Mg_{y/2}Si_{y/2})O_{12}$:$Ce_x$ (I)

where
a+b+c+d+e+f+g+h+i+j+k=1
x=0.005 to 0.1 and
y=0 to 4.0.

A garnet structure here is of course also taken to mean a structure based on flaws or lattice defects which differs slightly from the ideal case of garnet, so long as this crystal retains the typical garnet structure. The typical garnet structure is generally taken to mean $A_3B_5O_{12}$:D, where A=rare-earth metal (RE); B=Al, Ga; and D=activator which replaces RE, such as, for example, cerium.

It is preferred for the doping concentration of the cerium to be between 0.5 and 10% by weight. It is particularly preferably between 2.0 and 5.0% by weight and most preferably between 3.0 and 3.5% by weight. At a cerium concentration of between 3.0 and 3.5% by weight, increased absorption generally occurs and consequently an increased light yield or greater luminance of the phosphor arises. A higher cerium concentration would reduce the quantum yield and thus in turn result in a reduced light yield.

The degree of substitution y essentially determines the position of the emission maximum of the above composition. For $Y_3Al_{5-y}Mg_{y/2}Si_{y/2}O_{12}$:Ce, the maximum of the $Ce^{3+}$ emission band can thus be shifted from 555 to 605 nm. The co-dopants Sb, Ir, Th, Se do not have a significant influence on the position of the emission maximum or the colour point of the phosphors according to the invention.

The red shift found can be explained as follows by means of the theories known to the person skilled in the art: the covalent character of the Ce—O bonds, i.e. the effective negative charge of the anions and the overlap between the anion and activator orbitals, is responsible for the red shift of the YAG:Ce phosphors. In general, it can be noted that the $Ce^{3+}$ emission band of the $[Xe]5d^1 \to [Xe]4f^1$ interconfiguration transition is shifted into the red spectral region with increasing covalent character and at the same time the decay time is reduced, since the energy separation of the ground state $[Xe]4f^1$ from the 1st excited state $[Xe]5d^1$ is reduced by the decrease in the Stark effect. This also explains why substitution of $O^{2-}$ by $N^{3-}$, as already described in the literature (A. A. Setlur, W. J. Heward, M. E. Hannah, U. Happek, *Chem. Mater.* 20 (2008) 6227) has the same effect.

The greater luminance of the phosphors of the formulae I to V according to the invention compared with those of identical compositions, but without the co-dopants Se, Th, Ir, Sb, can be explained by means of the theories known to the person skilled in the art by the fact that these ions have an effect on the lifetime of the excited $Ce^{3+}$ states $[Xe]5d^1$ in that the lifetime is shortened. In this case, the $[Xe]5d^1$ electrons return to the ground state $[Xe]4f^1$ more quickly with emission of the fluorescence radiation. From there, the electrons can immediately be re-excited and subsequently re-emit. Under these prerequisites, the phosphor is capable of absorbing more light and emitting more light in the same time unit, resulting in greater luminance. The co-doping does not result in a significant red shift.

Particular preference is given to a phosphor of the formula I, where the compound of the formula I is a compound selected from the compounds of the formulae II to V:

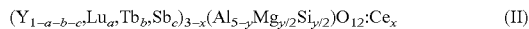 (II)

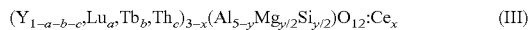 (III)

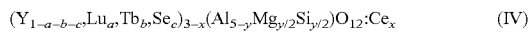 (IV)

 (V)

where, for the formulae II to V,
x=0.005 to 0.1
y=0 to 4.0
a+b+c=1 and a=0 to 0.9995; b=0 to 0.9995; c=0.0005 to 0.1.
Preferably, x=0.015 to 0.05.

The particle size of the phosphors according to the invention is between 50 nm and 30 μm, preferably between 1 μm and 20 μm, more preferably between 2 and 10 μm.

In a further embodiment, the phosphor of the formula I may additionally comprise at least one further of the following phosphor materials: oxides, molybdates, tungstates, vanadates, group III nitrides, (oxy)nitrides, in each case individually or mixtures thereof with one or more activator ions, such as Ce, Eu, Mn, Cr and/or Bi.

This is particularly advantageous if certain colour spaces are to be set.

In a further preferred embodiment, the phosphor has a structured (for example pyramidal) surface on the side opposite an LED chip (see WO2008/058619, Merck, which is incorporated in its full scope into the context of the present application by way of reference). Thus, as much light as possible can be coupled out of the phosphor.

The structured surface on the phosphor is produced by subsequent coating with a suitable material, which is already structured, or in a subsequent step by (photo)lithographic processes, etching processes or by writing processes using energy beams or material jets or the action of mechanical forces.

In a further preferred embodiment, the phosphors according to the invention have, on the side opposite an LED chip, a rough surface which carries nanoparticles of $SiO_2$, $TiO_2$, $Al_2O_3$, $ZnO_2$, $ZrO_2$ and/or $Y_2O_3$ or combinations of these materials and/or particles having the phosphor composition of the formula I with or without dopants from the series Ce, Th, Ir, Sb and/or Se. A rough surface here has a roughness of up to a few 100 nm. The coated surface has the advantage that total reflection can be reduced or prevented and the light can be coupled out of the phosphor according to the invention better (see WO 2008/058619 (Merck), which is incorporated in its full scope into the context of the present application by way of reference).

It is furthermore preferred for the phosphors according to the invention to have, on the surface facing away from the chip, a layer of matched refractive index which simplifies coupling out of the primary radiation and/or of the radiation emitted by the phosphor element.

In a further preferred embodiment, the phosphors have a continuous surface coating which consists of $SiO_2$, $TiO_2$, $Al_2O_3$, ZnO, $ZrO_2$ and/or $Y_2O_3$ or mixed oxides thereof and/or of the phosphor composition of the formula I without the activator cerium. This surface coating has the advantage that a suitable graduation of the refractive index of the coating materials enables the refractive index to be matched to the environment. In this case, the scattering of the light at the surface of the phosphor is reduced and a greater proportion of the light can penetrate into the phosphor and be absorbed and converted there. In addition, the surface coating of matched refractive index enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the immediate environment. A further reason for encapsulation with a closed sheath is thermal decoupling of the actual phosphor from the heat arising in the chip. This heat results in a reduction in the fluorescence light yield of the phosphor and may also influence the colour of the fluorescence light. Finally, a coating of this type makes it possible to increase the efficiency of the phosphor by preventing lattice vibrations arising in the phosphor from propagating into the environment.

In addition, it is preferred for the phosphors to have a porous surface coating which consists of $SiO_2$, $TiO_2$, $Al_2O_3$, ZnO, $ZrO_2$ and/or $Y_2O_3$ or mixed oxides thereof and/or of the phosphor composition of the formula I with or without dopants from the series Ce, Th, Ir, Sb and/or Se. These porous coatings offer the possibility of further reducing the refractive index of a single layer. Porous coatings of this type can be produced by three conventional methods, as described in WO 03/027015, which is incorporated in its full scope into the context of the present application by way of reference: etching of glass (for example soda-lime glasses (see U.S. Pat. No. 4,019,884)), application of a porous layer, and combination of a porous layer and an etching process.

In a further preferred embodiment, the phosphors have a surface which carries functional groups which facilitate chemical or physical bonding to the environment, preferably consisting of epoxy or silicone resin. These functional groups can be esters or other derivatives bonded, for example, via oxo groups which are able to form links to constituents of the binders based on epoxides and/or silicones. Surfaces of this type have the advantage that homogeneous incorporation of the phosphors into the binder is facilitated. Furthermore, the rheological properties of the phosphor/binder system and also the pot lives can thus be adjusted to a certain extent. Processing of the mixtures is thus simplified. Physical bonding to the environment in this connection is taken to mean electrostatic interactions between the systems via charge fluctuations or partial charges.

Since the phosphor layer according to the invention applied to the LED chip preferably consists of a mixture of silicone and homogeneous phosphor particles, and the silicone has a surface tension, this phosphor layer is non-uniform at a microscopic level or the thickness of the layer is not constant throughout.

Furthermore, the phosphors according to the invention may comprise 0 to 20% by weight of alkali or alkaline-earth metals, such as Li, Na, K, Ca, Sr, Ba, and halides, such as F or Cl. These are preferably employed as fluxing agent in phosphor preparation and serve for increasing the crystal quality, rough setting of the particle size and the particle morphology and thus have high potential for increasing the efficiency of the phosphors.

The present invention furthermore relates to a phosphor having a garnet structure obtainable by mixing aluminium-, magnesium, silicon, yttrium-and cerium-containing starting materials with at least one antimony-, selenium-, iridium- and/or thorium-containing co-dopant by solid-state diffusion methods and subsequent thermal aftertreatment, which phosphor may comprise a fluxing agent from the series of the alkali or alkaline-earth metal halides or a borate compound.

The starting materials for the preparation of the phosphor consist, as mentioned above, of the base material (for example oxides of aluminium, yttrium; silicon, magnesium and cerium) and at least one Sb, Se, Ir or Th-containing dopant and optionally further Lu— or Tb-containing materials. Besides oxides, suitable starting materials are also further inorganic and/or organic substances, such as nitrates, carbonates, hydrogencarbonates, phosphates, carboxylates, alkoxides, acetates, oxalates, halides, sulfates, organometallic compounds, hydroxides of the metals, semi-metals, transition metals and/or rare earths, which may be dissolved and/or suspended in inorganic and/or organic liquids. Preference is given to the use of oxides which contain the corresponding elements in the requisite stoichiometric ratio.

The present invention furthermore relates to a process for the preparation of a phosphor having the following process steps:
a) preparation of a cerium-activated phosphor which is co-doped with Sb—, Se—, Ir— and/or Th-containing materials, by mixing at least 5 starting materials selected from Y—, Al—, Mg—, Si—. Ce—, Lu—, Tb-containing materials,
b) thermal aftertreatment of the Sb—, Se—, Ir— and/or Th-co-doped phosphor.

Besides the preferred preparation of the phosphors via solid-state diffusion method, the following known wet-chemical methods can also be employed:

co-precipitation with an $NH_4HCO_3$ solution (see, for example, Jander, *Blasius Lehrbuch der analyt. u. präp. anorg. Chem. [Textbook of Analyt. and Prep. Inorg. Chem.]* 2002)

Pecchini method using a solution of citric acid and ethylene glycol (see, for example, *Annual Review of Materials Research Vol.* 36: 2006, 281-331)

combustion method using urea spray-drying of aqueous or organic salt solutions (starting materials)

spray pyrolysis of aqueous or organic salt solutions (starting materials)

evaporation of nitrate solutions and thermal conversion of the residue

In the above-mentioned co-precipitation, an $NH_4HCO_3$ solution is added, for example, to nitrate solutions of the corresponding phosphor starting materials, resulting in the formation of the phosphor precursor.

In the Pecchini method, a precipitation reagent consisting of citric acid and ethylene glycol is added, for example, to the above-mentioned nitrate solutions of the corresponding phosphor starting materials at room temperature, and the mixture is subsequently heated. Increasing the viscosity results in phosphor precursor formation.

In the known combustion method, the above-mentioned nitrate solutions of the corresponding phosphor starting materials are, for example, dissolved in water, then boiled under reflux and treated with urea, resulting in the slow formation of the phosphor precursor.

Spray pyrolysis is one of the aerosol methods, which are characterised by spraying solutions, suspensions or dispersions into a reaction space (reactor) heated in various ways and the formation and deposition of solid particles. In contrast to spray-drying using hot-gas temperatures<200° C., thermal decomposition of the starting materials used (for example salts) and the re-formation of substances (for example oxides, mixed oxides) additionally occur, in addition to evaporation of the solvent, in spray pyrolysis as a high-temperature process.

The 6 method variants mentioned above are described in detail in WO2007/144060 (Merck), which is incorporated in its full scope into the context of the present application by way of reference.

In the above-mentioned thermal aftertreatment, it is preferred for the calcination to be carried out at least partly under reducing conditions (for example using carbon monoxide, forming gas, pure or hydrogen or at least a vacuum or oxygen-deficient atmosphere).

The above-mentioned methods enable any desired outer shapes of the phosphor particles to be produced, such as spherical particles, flakes or structured materials and ceramics.

As a further preferred embodiment, flake-form phosphors are prepared by conventional processes from the corresponding metal and/or rare-earth salts. The preparation process is described in detail in EP 763573 and WO2008/058620, which are incorporated in their full scope into the context of the present application by way of reference. These flake-form phosphors can be prepared by coating a natural or synthetically produced, highly stable support or a substrate of, for example, mica flakes, $SiO_2$ flakes, $Al_2O_3$ flakes, $ZrO_2$ flakes, glass flakes or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from a material.

If the flake itself serves merely as support for the phosphor coating, the latter must consist of a material which is transparent to the primary radiation from the LED, or absorbs the primary radiation and transmits this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 μm, preferably between 150 nm and 5 μm. The diameter here is from 50 nm to 20 μm.

These generally have an aspect ratio (ratio of the diameter to the particle thickness) of 1:1 to 400:1 and in particular 3:1 to 100:1.

The flake size (length×width) is dependent on the arrangement. Flakes are also suitable as centres of scattering within the conversion layer, in particular if they have particularly small dimensions.

The surface of the flake-form phosphor according to the invention facing the LED chip can be provided with a coating which has a reflection-reducing action in relation to the primary radiation emitted by the LED chip. This results in a reduction in back-scattering of the primary radiation, enhancing coupling of the latter into the phosphor element according to the invention.

Suitable for this purpose are, for example, refractive-index-matched coatings, which must have a following thickness d: d=[wavelength of the primary radiation from the LED chip/(4*refractive index of the phosphor ceramic)], see, for example, Gerthsen, Physik [Physics], Springer Verlag, 18th Edition, 1995. This coating may also consist of photonic crystals, which also encompasses structuring of the surface of the flake-form phosphor in order to achieve certain functionalities.

The preparation of the phosphors according to the invention in the form of ceramic elements is carried out analogously to the process described in WO 2008/017353 (Merck), which is incorporated in its full scope into the context of the present application by way of reference. The phosphor here is prepared by mixing the corresponding starting materials and dopants by wet-chemical methods, subsequently pressed isostatically and applied directly to the surface of the chip in the form of a homogeneous, thin and non-porous flake. No location-dependent variation of the excitation and emission of the phosphor thus takes place, causing the LED provided therewith to emit a homogeneous light cone of constant colour and to have high luminous power. The ceramic phosphor elements can be produced on a large industrial scale, for example, as flakes in thicknesses from a few 100 nm to about 500 μm. The flake size (length×width) is dependent on the arrangement. In the case of direct application to the chip, the size of the flake should be selected in accordance with the chip size (from about 100 μm*100 μm to several mm$^2$) with a certain excess size of about 10%-30% of the chip surface in the case of a suitable chip arrangement (for example flip-chip arrangement) or correspondingly. If the phosphor flake is installed on top of a finished LED, all of the emitted light cone will hit the flake.

The side surfaces of the ceramic phosphor element can be metallised with a light or noble metal, preferably aluminium or silver. The metallisation has the effect that light does not exit laterally from the phosphor element. Light exiting laterally can reduce the light flux to be coupled out of the LED. The metallisation of the ceramic phosphor element is carried out in a process step after isostatic pressing to give rods or flakes, where, if desired, the rods or flakes can be cut to the necessary size before the metallisation. To this end, the side surfaces are wetted, for example with a solution of silver nitrate and glucose, and subsequently exposed to an ammonia atmosphere at elevated temperature. During this operation, a silver coating, for example, forms on the side surfaces.

Alternatively, electroless metallisation processes are suitable, see, for example, Hollemann-Wiberg, Lehrbuch der anorganischen Chemie [Textbook of Inorganic Chemistry], Walter de Gruyter Verlag, or Ullmanns Enzyklopädie der chemischen Technologie [Ullmann's Encyclopaedia of Chemical Technology].

The ceramic phosphor element can, if necessary, be fixed to the substrate of an LED chip using a water-glass solution.

In a further embodiment, the ceramic phosphor element has a structured (for example pyramidal) surface on the side opposite an LED chip. This enables as much light as possible to be coupled out of the phosphor element. The structured surface on the phosphor element is produced by carrying out the isostatic pressing using a mould having a structured press plate and thus embossing a structure into the surface. Structured surfaces are desired if the aim is to produce the thinnest possible phosphor elements or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are $2/3$ to $5/6$ of the melting point of the substance to be pressed.

In addition, the phosphors according to the invention can be excited over a broad range, which extends from about 410 nm to 530 nm, preferably 430 nm to about 500 nm. These phosphors are thus not only suitable for excitation by UV or blue-emitting primary light sources, such as LEDs, or conventional discharge lamps (for example based on Hg), but also for light sources like those which utilise the blue $In^{3+}$ line at 451 nm.

The present invention furthermore relates to an illumination unit having at least one primary light source whose emission maximum or maxima is or are in the range 410 nm to 530 nm, preferably 430 nm to about 500 nm, particularly preferably 440 to 480 nm, where all or some of the primary radiation is converted into longer-wavelength radiation by the phosphors according to the invention. This illumination unit preferably emits white light or emits light having a certain colour point (colour-on-demand principle). Preferred embodiments of the illumination units according to the invention are depicted in FIGS. 9 to 20.

In a preferred embodiment of the illumination unit according to the invention, the light source is a luminescent indium aluminium gallium nitride, in particular of the formula $In_iGa_jAl_kN$, where $0 \leq i$, $0 \leq j$, $0 \leq k$, and $i+j+k=1$. Possible forms of light sources of this type are known to the person skilled in the art. They can be light-emitting LED chips having various structures.

In a further preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source.

The phosphors according to the invention can either be dispersed in a resin (for example epoxy or silicone resin) or, given suitable size ratios, arranged directly on the primary light source or, depending on the application, arranged remote therefrom (the latter arrangement also includes "remote phosphor technology"). The advantages of remote phosphor technology are known to the person skilled in the art and are revealed, for example, in the following publication: Japanese Journ. of Appl. Phys. Vol. 44, No. 21 (2005). L649-L651.

In a further embodiment, it is preferred for the optical coupling of the illumination unit between the phosphor and the primary light source to be achieved by a light-conducting arrangement. This enables the primary light source to be installed at a central location and to be optically coupled to the phosphor by means of light-conducting devices, such as, for example, light-conducting fibres. In this way, lamps matched to the illumination wishes and merely consisting of one or different phosphors, which may be arranged to form a light screen, and a light conductor, which is coupled to the primary light source, can be achieved. In this way, it is possible to position a strong primary light source at a location which is favourable for the electrical installation and to install lamps comprising phosphors which are coupled to the light conductors at any desired locations without further electrical cabling, but instead only by laying light conductors.

The present invention furthermore relates to the use of the phosphors according to the invention for partial or complete conversion of the blue or near-UV emission from a luminescent diode.

The phosphors according to the invention are furthermore preferably used for conversion of the blue or near-UV emission into visible white radiation. The phosphors according to the invention are furthermore preferably used for conversion of the primary radiation into a certain colour point by the "colour-on-demand" concept.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$, or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always given in ° C. It furthermore goes without saying that, both in the description and also in the examples, the added amounts of the components in the compositions always add up to a total of 100%. Percentage data given should always be regarded in the given connection. However, they usually always relate to the weight of the part-amount or total amount indicated.

EXAMPLES

Example 1a

Preparation of the Orange-Emitting Phosphor of the Composition $(Y,Lu)_3AlMg_2Si_2O_{12}$:Ce The starting materials 4.4728 g of $Y_2O_3$, 15.5193 g of $Lu_2O_3$, 2.1207 g of $Al_2O_3$, 0.4130 g of $CeO_2$, 8.0094 g of $MgCO_3$ and 4.9067 g of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 1b

Preparation of the Orange-Emitting Sb—Co-Doped Phosphor of the composition $(Y,Lu,Sb)_3AlMg_2Si_2O_{12}$:Ce, where Lu:Sb=92:8

The starting materials 4.4728 g (20 mmol) of $Y_2O_3$, 14.2778 g (36 mmol) of $Lu_2O_3$, 0.9108 g (3 mmol) of $Sb_2O_3$, 2.1207 g (21 mmol) of $Al_2O_3$, 0.4130 g (2 mmol) of $CeO_2$, 8.0094 g (95 mmol) of $MgCO_3$ and 4.9067 g (82 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 1c

Preparation of the Orange-Emitting Th-Coded Phosphor of The Composition $(Y,Lu,Th)_3AlMg_2Si_2O_{12}$:Ce, where Lu:Th=92:8

The starting materials 4.4728 g (20 mmol) of $Y_2O_3$, 14.2778 g (36 mmol) of $Lu_2O_3$, 1.5840 g (6 mmol) of $ThO_2$, 2.1207 g (21 mmol) of $Al_2O_3$, 0.4130 g of $CeO_2$, 8.0094 g (95 mmol) of $MgCO_3$ and 4.9067 g (82 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 1d

Preparation of the Orange-Emitting Se—Co-Doped Phosphor of the Composition $(Y,Lu,Se)_3AlMg_2Si_2O_{12}$:Ce, where Lu:Se=92:8

The starting materials 4.4728 g (20 mmol) of $Y_2O_3$, 14.2778 g (36 mmol) of $Lu_2O_3$, 06480 g (6 mmol) of $SeO_2$, 2.1207 g (21 mmol) of $Al_2O_3$, 0.4130 g $CeO_2$, 8.0094 g (95 mmol) of $MgCO_3$ and 4.9067 g (82 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 1e

Preparation of the Orange-Emitting Ir—Co-Doped Phosphor of the Composition $(Y,Lu,Ir)_3AlMg_2Si_2O_{12}$:Ce, where Lu:Ir=92:8

The starting materials 4.4728 g (20 mmol) of $Y_2O_3$, 14.2778 g (36 mmol) of $Lu_2O_3$, 1.2690 g (3 mmol) of $Ir_2O_3$, 2.1207 g (21 mmol) of $Al_2O_3$, 0.4130 g $CeO_2$, 8.0094 g (95 mmol) of $MgCO_3$ and 4.9067 g (82 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 2a

Preparation of the Orange-Emitting Phosphor of the Composition $(Y,Lu)_3Al_3MgSiO_{12}$:Ce The starting materials 4.4728 g (20 mmol) of $Y_2O_3$, 15.5193 g (39 mmol) of $Lu_2O_3$, 6.3623 g (62 mmol) of $Al_2O_3$, 0.4130 g (2 mmol) of $CeO_2$, 4.0471 g (48 mmol) of $MgCO_3$ and 2.4039 g (40 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 2b

Preparation of the Orange-Emitting Th—Co-Doped Phosphor of the Composition $(Y,Lu,Th)_3Al_3MgSiO_{12}$:Ce, where Lu:Th=92:8

The starting materials 4.4728 g (20 mmol) of $Y_2O_3$, 14.280 g (36 mmol) of $Lu_2O_3$, 0.8237 g (3 mmol) of $ThO_2$, 6.3623 g (62 mmol) of $Al_2O_3$, 0.4130 g (2 mmol) of $CeO_2$, 4.0471 g (48 mmol) of $MgCO_3$ and 2.4039 g (40 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 2c

Preparation of the Orange-Emitting Se—Co-Doped Phosphor of the Composition $(Y,Lu,Se)_3Al_3MgSiO_{12}$:Ce, where Lu:Se=92:8

The starting materials 4.4728 g (20 mmol) of $Y_2O_3$, 14.280 g (36 mmol) of $Lu_2O_3$, 0.3241 g (3 mmol) $SeO_2$, 6.3623 g (62 mmol) of $Al_2O_3$, 0.4130 g (2 mmol) of $CeO_2$, 4.0471 g (48 mmol) of $MgCO_3$ and 2.4039 g (40 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 2d

Preparation of the Orange-Emitting Ir—Co-Doped Phosphor of the Composition $(Y,Lu,Ir)_3Al_3MgSiO_{12}$:Ce, where Lu:Ir=92:8

The starting materials 4.4728 g (20 mmol) of $Y_2O_3$, 14.280 g (36 mmol) of $Lu_2O_3$, 0.648 g (1.5 mmol) of $Ir_2O_3$, 6.3623 g (62 mmol) of $Al_2O_3$, 0.4130 g (2 mmol) of $CeO_2$, 4.0471 g (48 mmol) of $MgCO_3$ and 2.4039 g (40 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

Example 2e

Preparation of the Orange-Emitting Sb—Co-Doped Phosphor of the Composition $(Y,Lu,Sb)_3Al_3MgSiO_{12}$:Ce, where Lu:Sb=92:8

The starting materials 4.4728 g (20 mmol) of $Y_2O_3$, 14.280 g (36 mmol) of $Lu_2O_3$, 0.4382 g (1.5 mmol) of $Sb_2O_3$, 6.3623 g (62 mmol) of $Al_2O_3$, 0.4130 g (2 mmol) of $CeO_2$, 4.0471 g (48 mmol) of $MgCO_3$ and 2.4039 g (40 mmol) of $SiO_2$ are ground for 45 min in 50 ml of ethanol. The resultant paste is then dried in a drying cabinet and placed in a corundum crucible. The paste is subsequently sintered at 1500° C. under CO for 8 h, and the resultant sinter cake is comminuted in an agate mortar, and finally the powder is sieved through a 36 μm sieve.

DESCRIPTION OF THE FIGURES

The invention will be explained in greater detail below with reference to a number of working examples. The figures show the following.

Figure 1:
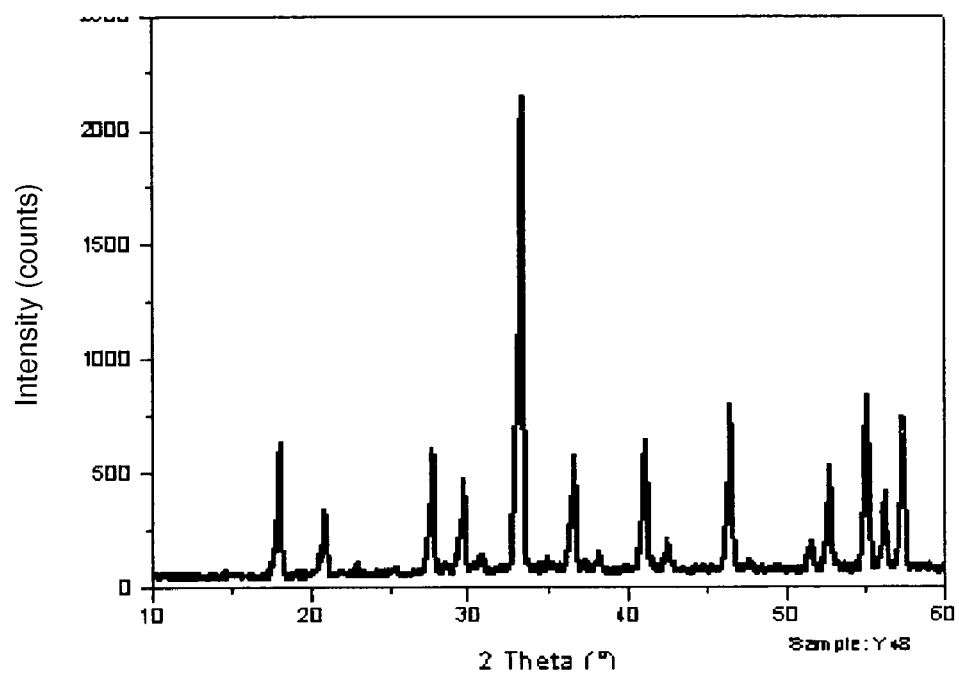
FIG. 1: shows the X-ray powder diffraction pattern of $(Y,Lu)_3AlMg_2Si_2O_{12}$:Ce,X (where X=Th, Ir, Sb, Se), Cu Kα radiation.
Figure 2:
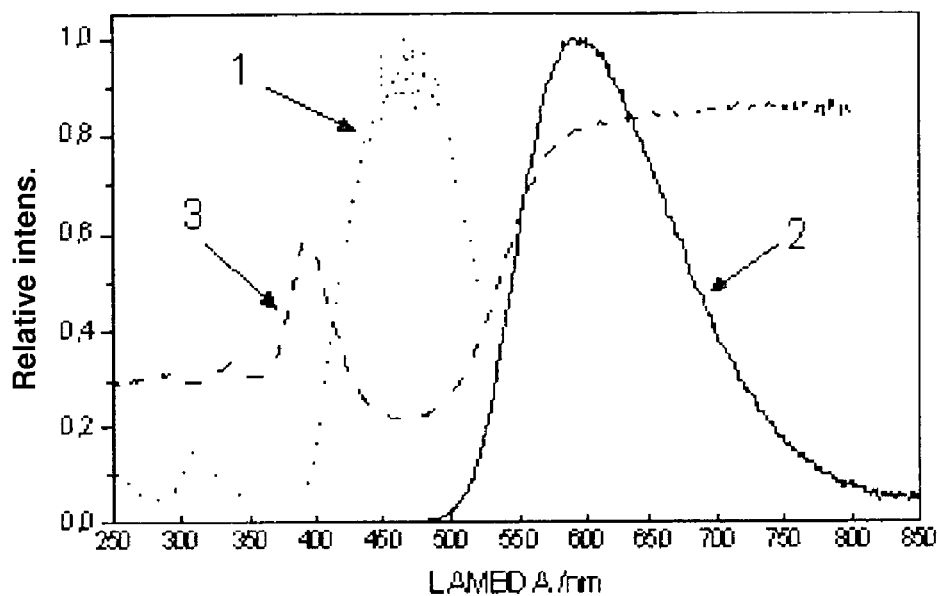
FIG. 2: shows the excitation (1), emission (2) and reflection spectrum (3) of $(Y_{0.99}Lu_{1.95}Ce_{0.66})_3AlMg_2Si_2O_{12}$.
Figure 3:
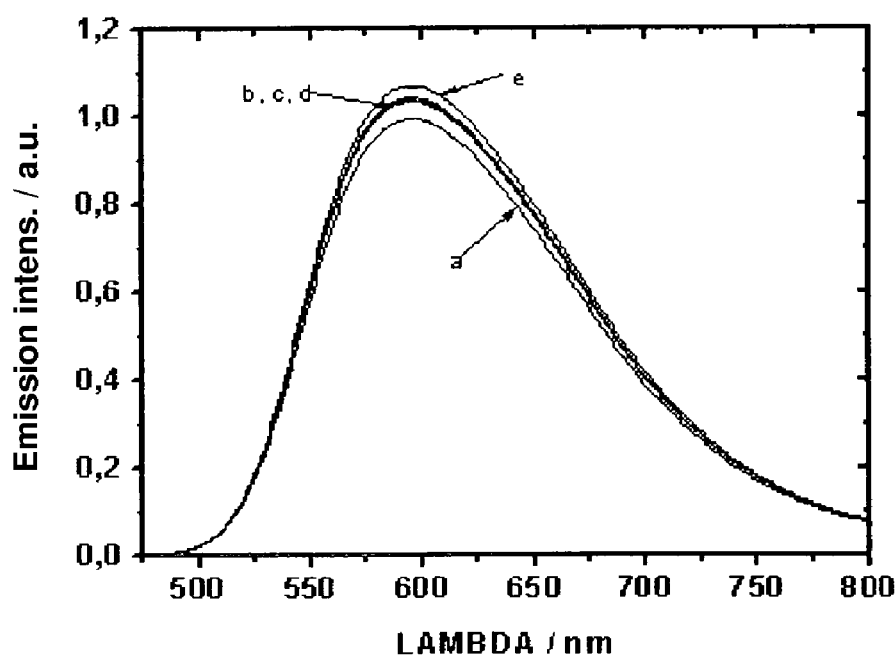
FIG. 3: shows emission spectra of the phosphors according to the invention from Working Examples 1a to 1e. It is clear here that the co-doping (spectra b, c, d and e) increases the luminance (emission intensity) compared with the non-co-doped phosphor.
Figure 4:
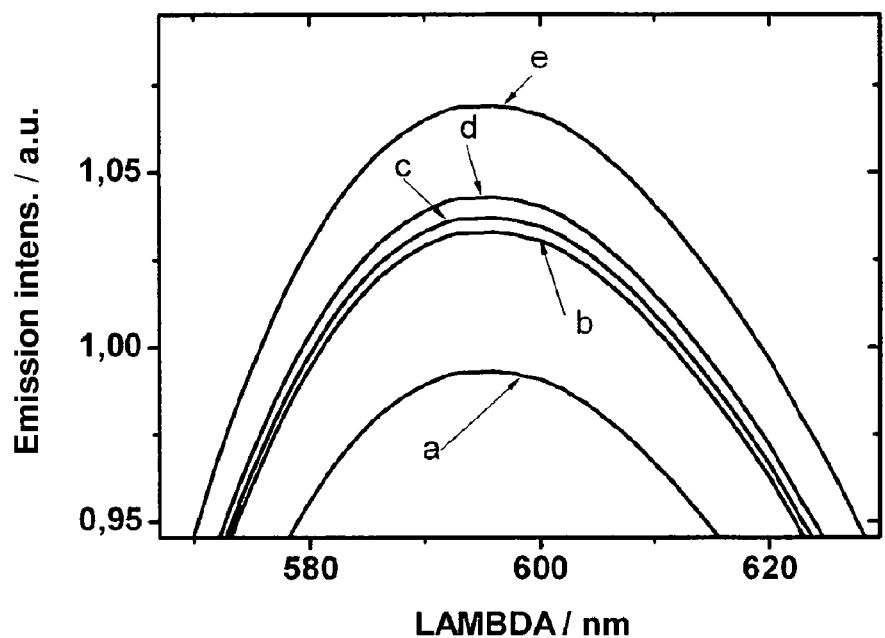
FIG. 4: shows a detail magnification from FIG. 3 for improved depiction of the emission peak maxima.
Figure 5:
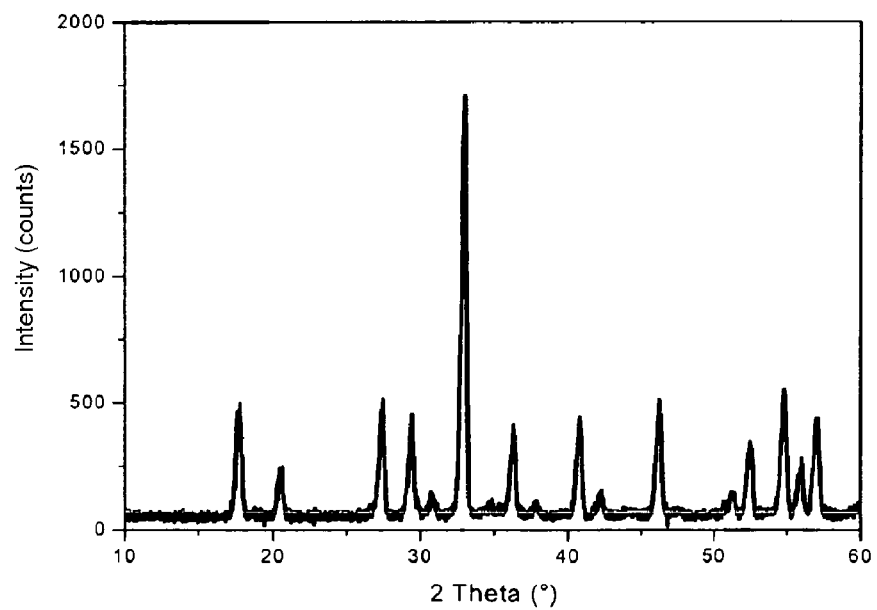
FIG. 5: shows an X-ray powder diffraction pattern of $(Y,Lu)_3Al_3MgSiO_{12}$:Ce,X, where X=Th, Ir, Se or Sb (Cu Kα radiation).
Figure 6:
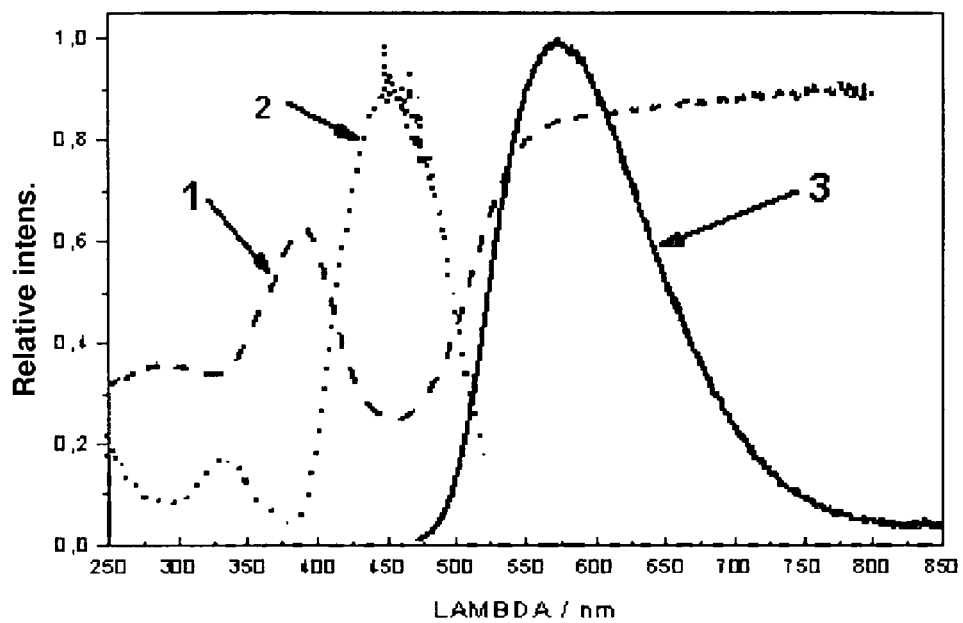
FIG. 6: shows an excitation (2), emission (3) and reflection spectrum (1) of $(Y,Lu)_3Al_3MgSiO_{12}$:Ce.
Figure 7:
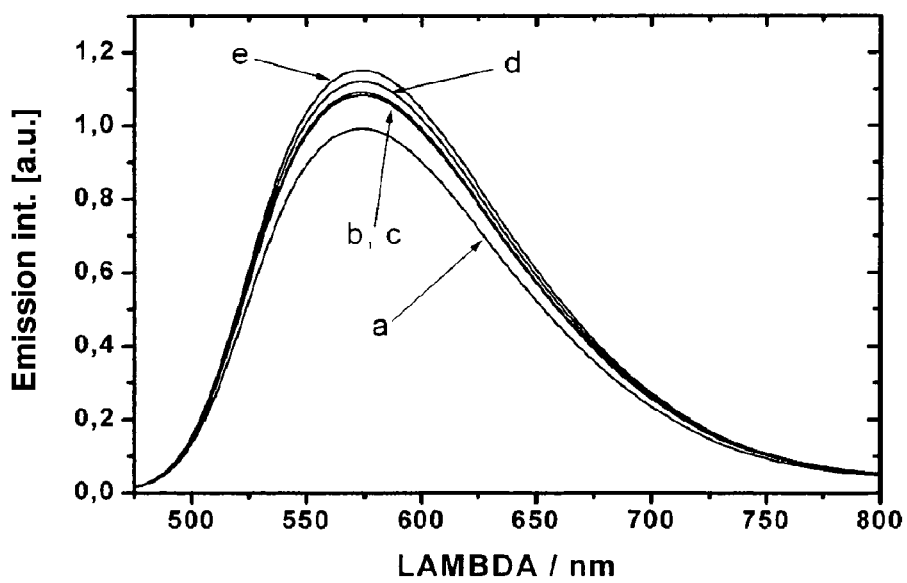
FIG. 7: shows emission spectra of the phosphors according to the invention from Working Examples 2a to e. The greater luminance of the co-doped phosphors (b to e) compared with the non-co-doped phosphor (a) is evident.
Figure 8:
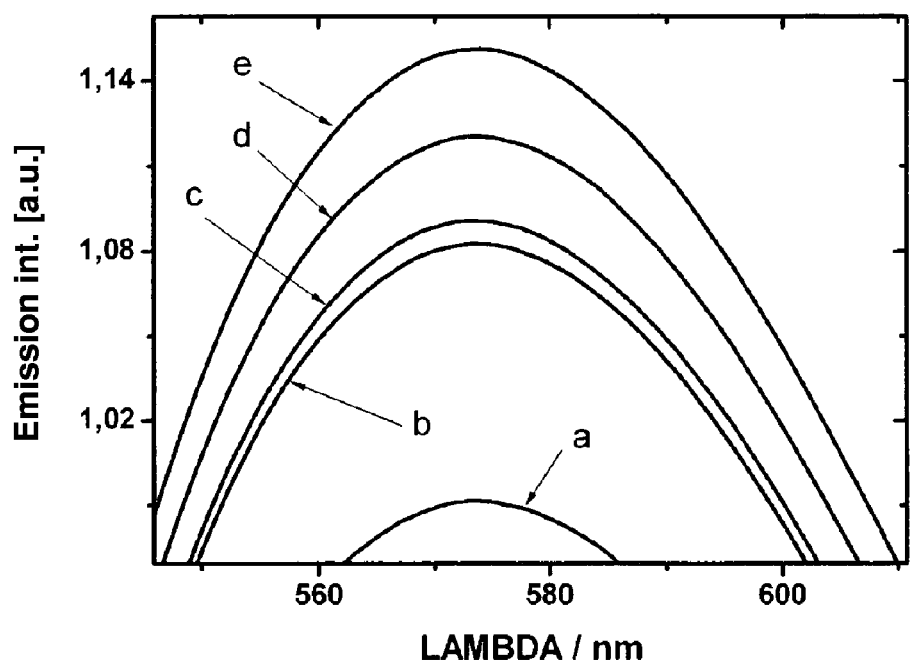
FIG. 8: shows a detail magnification from FIG. 7 for better differentiation of the peak maxima.
Figure 9:
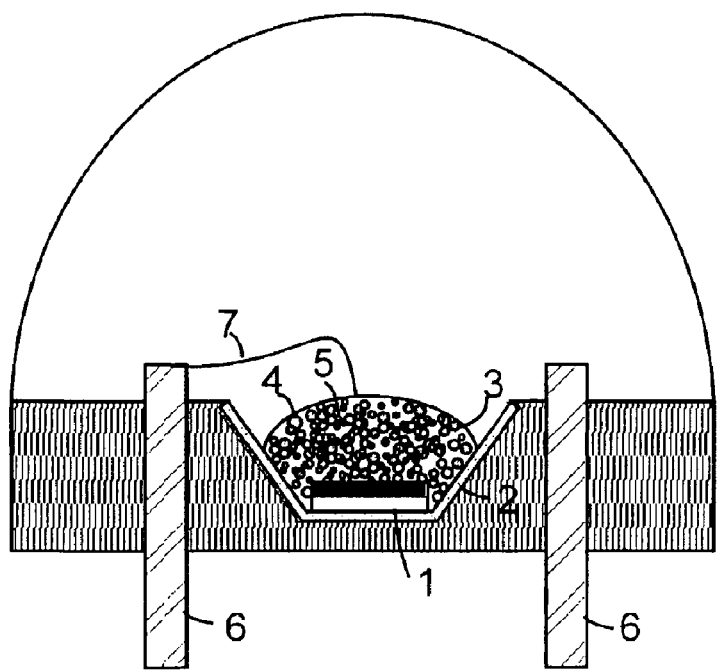
FIG. 9: shows a diagrammatic depiction of a light-emitting diode with a phosphor-containing coating. The component comprises a chip-like LED 1 as radiation source. The LED is a mounted a cup-shaped reflector, which is held by an adjustment frame 2. The chip 1 is connected to a first contact 6 via a flat cable 7 and directly to a second electrical contact 6'. A coating which comprises a conversion phosphor according to the invention has been applied to the inside curvature of the reflector cup. The phosphors are either employed separately from one another or as a mixture. (List of part numbers: 1 light-emitting diode, 2 reflector, 3 resin, 4 conversion phosphor, 5 diffuser, 6 electrodes, 7 flat cable)
Figure 10:
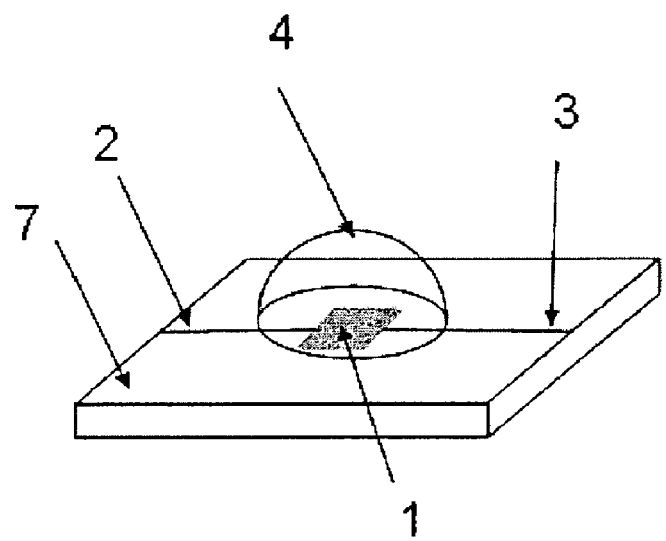
FIG. 10: shows a COB (chip on board) package of the InGaN type, which serves as light source (LED) for white light (1=semiconductor chip; 2,3=electrical connections; 4=conversion phosphor; 7=board) The phosphor is distributed in a binder lens, which simultaneously represents a secondary optical element and influences the light emission characteristics as a lens.
Figure 11:
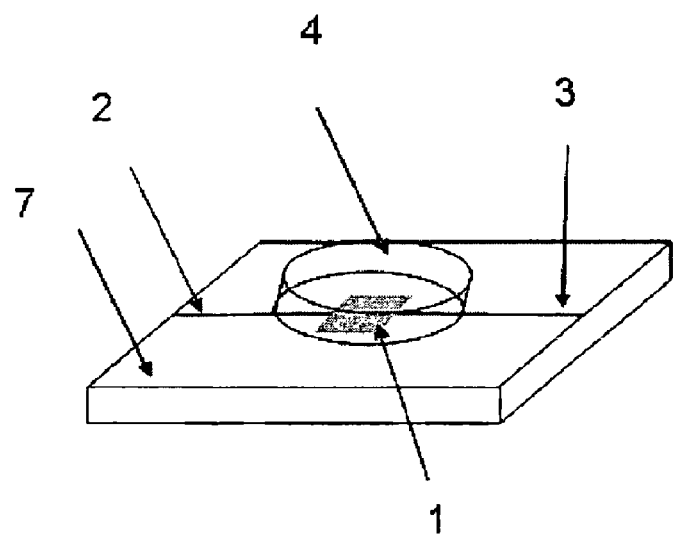
FIG. 11: shows a COB (chip on board) package of the InGaN type, which serves as light source (LED) for white light (1=semiconductor chip; 2,3=electrical connections; 4=conversion phosphor; 7=board) The phosphor is located in a thin binder layer directly on the LED chip. A secondary optical element consisting of a transparent material can be placed thereon.
Figure 12:
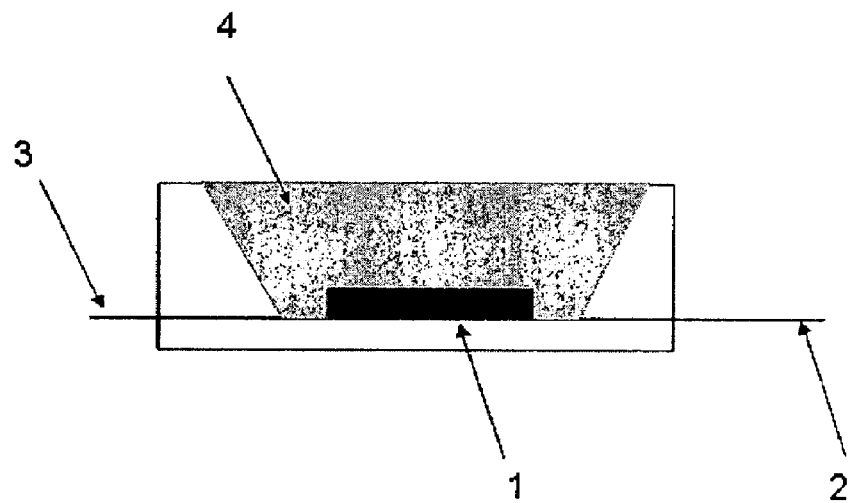
FIG. 12: shows a Golden Dragon® package which serves as light source (LED) for white light (1=semiconductor chip; 2,3=electrical connections; 4=conversion phosphor in cavity with reflector). The conversion phosphor is dispersed in a binder, where the mixture fills the cavity.
Figure 13:
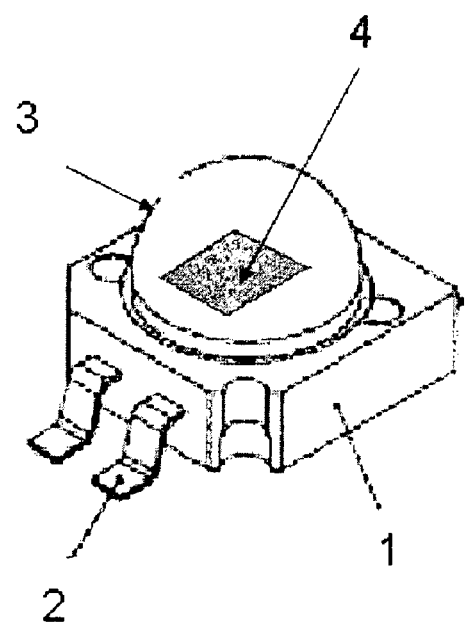
FIG. 13: shows a Luxeon® package, where 1=casing; 2=electrical connection; 3=lens; 4=semiconductor chip. This design has the advantage that it is a flip chip design, where a greater proportion of the light from the chip can be used for light purposes above the transparent substrate and a reflector on the base. In addition, heat dissipation is favoured in this design.
Figure 14:
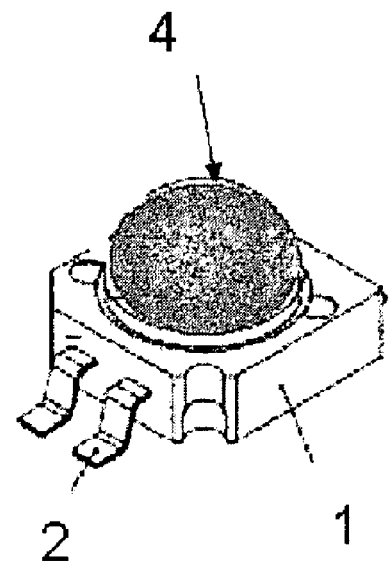
FIG. 14: shows a package, where 1=casing; 2=electrical connection; 4=semiconductor chip, and the cavity beneath the lens is completely filled with the conversion phosphor according to the invention. This package has the advantage that a greater amount of conversion phosphor can be used. This can also act as remote phosphor.
Figure 15:
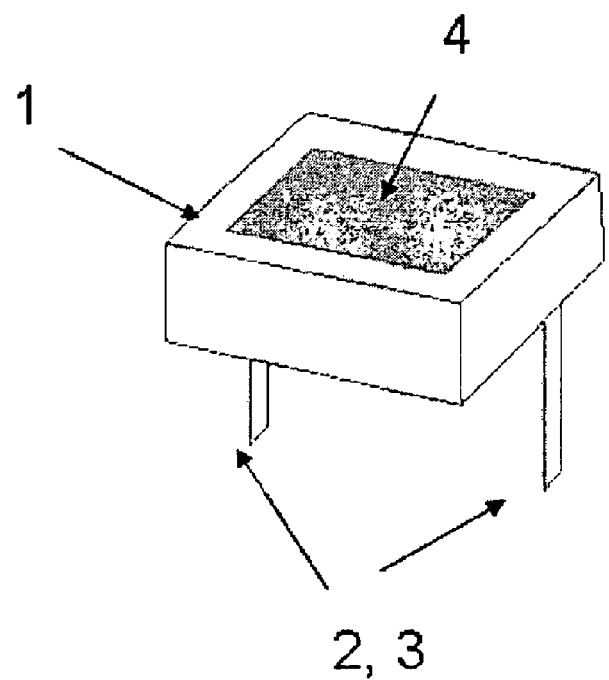
FIG. 15: shows an SMD package (surface mounted package), where 1=casing; 2,3=electrical connections; 4=conversion layer. The semiconductor chip is completely covered with the phosphor according to the invention. The SMD design has the advantage that it has a small physical shape and thus fits into conventional lamps.
Figure 16:
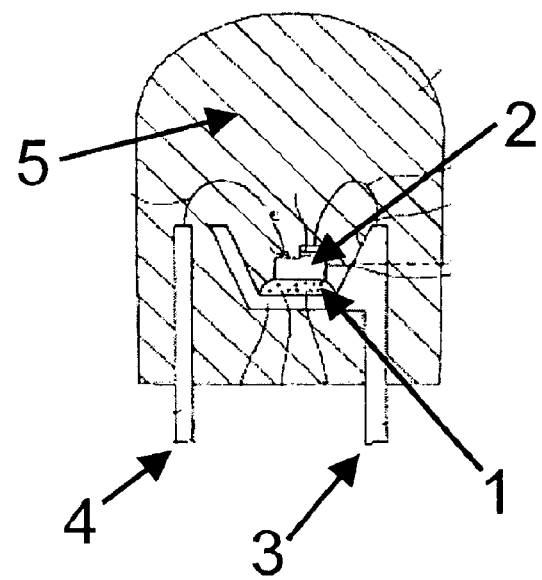
FIG. 16: shows a T5 package, where 1=conversion phosphor; 2=chip; 3,4=electrical connections; 5=lens with transparent resin. The conversion phosphor is located on the back of the LED chip, which has the advantage that the phosphor is cooled via the metallic connections.
Figure 17:
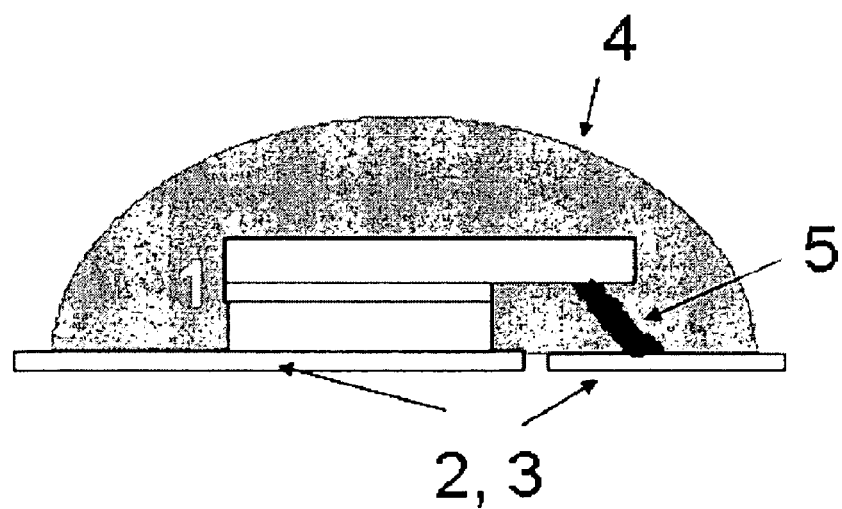
FIG. 17: shows a diagrammatic depiction of a light-emitting diode, where 1=semiconductor chip; 2,3=electrical connections; 4=conversion phosphor; 5=bond wire, where the phosphor is applied in a binder as top globe. This form of the phosphor/binder layer can act as secondary optical element and can influence, for example, light propagation.
Figure 18:
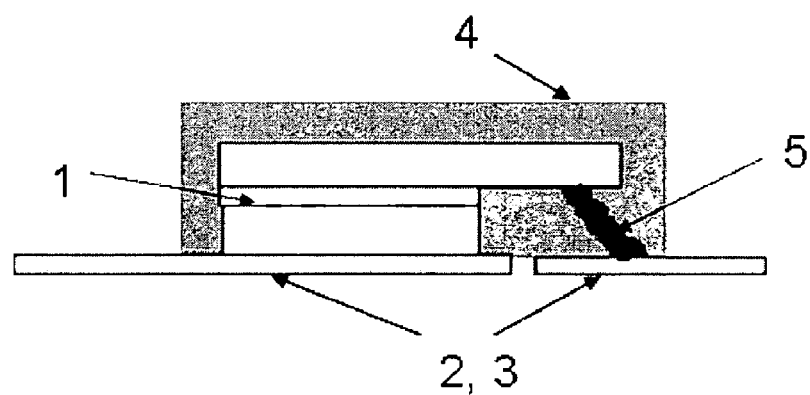
FIG. 18: shows a diagrammatic depiction of a light-emitting diode, where 1=semiconductor chip; 2,3=electrical connections; 4=conversion phosphor; 5=bond wire, where the phosphor is applied as a thin layer dispersed in a binder. A further component acting as secondary optical element, such as, for example, a lens, can easily be applied to this layer.
Figure 19:
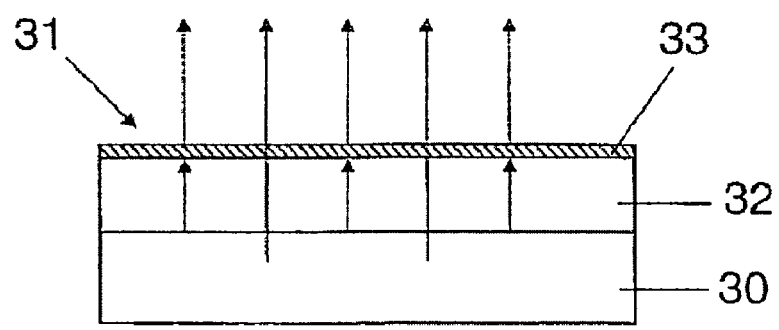
FIG. 19: shows an example of a further application, as is already known in principle from U.S. Pat. No. 6,700,322. The phosphor according to the invention is used here together with an OLED. The light source is an organic light-emitting diode 31, consisting of the actual organic film 30 and a transparent substrate 32. The film 30 emits, in particular, blue primary light, produced, for example, by means of PVK: PBD:coumarin (PVK, abbreviation for poly-(n-vinylcarbazole); PBD, abbreviation for 2-(4-biphenyl)-5-(4-tert-butyl-phenyl)-1,3,4-oxadiazole). The emission is partially converted into yellow, secondarily emitted light by a cover layer, formed from a layer 33 of the phosphor according to the invention, so that white emission is achieved overall through colour mixing of the primarily and secondarily emitted light. The OLED essentially consists of at least one layer of a light-emitting polymer or of so-called small molecules between two electrodes, which consist of materials known per se, such as, for example, ITO (abbreviation for indium tin oxide), as anode and a highly reactive metal, such as, for example, Ba or Ca, as cathode. A plurality of layers which serve either as hole-transport layer or also as electron-transport layers in the region of the small molecules are often also used between the electrodes. The emitting polymers used are, for example, polyfluorenes or polyspiro materials.
Figure 20:
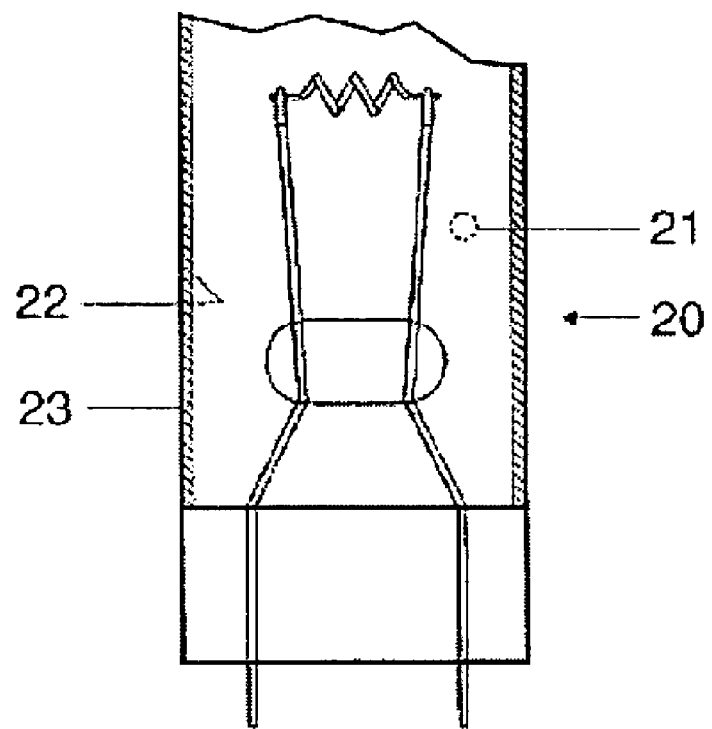
FIG. 20: shows a low-pressure lamp 20 with a mercury-free gas filling (schematised) which comprises an indium filling and a buffer gas analogously to WO 2005/061659, where a layer 22 comprising the phosphors according to the invention has been applied.

The invention claimed is:

1. A phosphor having a garnet structure of formula I

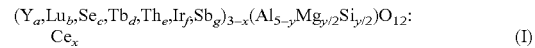

$$(Y_a Lu_b Se_c Tb_d Th_e Ir_f Sb_g)_{3-x}(Al_{5-y}Mg_{y/2}Si_{y/2})O_{12}:Ce_x \quad (I)$$

where
a+b+c+d+e+f+g+h+i=1
x=0.005 to 0.1
and
y>0 to 4.0.

2. A phosphor according to claim 1, wherein the compound of formula I is a compound of the formulae

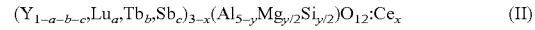

$$(Y_{1-a-b-c}Lu_a Tb_b Sb_c)_{3-x}(Al_{5-y}Mg_{y/2}Si_{y/2})O_{12}:Ce_x \quad (II)$$

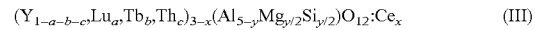

$$(Y_{1-a-b-c}Lu_a Tb_b Th_c)_{3-x}(Al_{5-y}Mg_{y/2}Si_{y/2})O_{12}:Ce_x \quad (III)$$

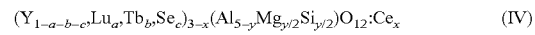

$$(Y_{1-a-b-c}Lu_a Tb_b Se_c)_{3-x}(Al_{5-y}Mg_{y/2}Si_{y/2})O_{12}:Ce_x \quad (IV)$$

$$(Y_{1-a-b-c}Lu_a Tb_b Ir_c)_{3-x}(Al_{5-y}Mg_{y/2}Si_{y/2})O_{12}:Ce_x \quad (V)$$

where, for the formulae II to V,
x=≧0.005 to 0.1
y>0 to 4.0
a+b+c=1 and a=0 to 0.9995; b=0 to 0.9995; c=0.0005 to 0.1.

3. The phosphor according to claim 1, having a rough surface which carries nanoparticles of $SiO_2$, $TiO_2$, $Al_2O_3$, ZnO, $ZrO_2$ and/or $Y_2O_3$ or mixed oxides thereof and/or particles having the phosphor composition of formula (I) with or without dopants from the series Ce, Th, Ir, Sb and/or Se.

4. The phosphor according to claim 1, having a continuous surface coating comprising $SiO_2$, $TiO_2$, $Al_2O_3$, ZnO, $ZrO_2$ and/or $Y_2O_3$ or mixed oxides thereof and/or of the phosphor composition of formula (I) without the activator Ce.

5. The phosphor according to claim 1, having a porous surface coating of $SiO_2$, $TiO_2$, $Al_2O_3$, ZnO, $ZrO_2$ and/or $Y_2O_3$ or mixed oxides thereof and/or of the phosphor composition of the formula (I) optionally with Ce, Th, Ir, Sb and/or Se dopants.

6. The phosphor according to claim 1, having a surface carrying functional groups which facilitate chemical or physical bonding to the environment-epoxy or silicone resin.

7. The phosphor according to claim 1, comprising 0 to 20% by weight of alkali or alkaline-earth metals and halides.

8. The phosphor according to claim 1, obtainable by mixing aluminium-, yttrium-, lutetium-, terbium-, magnesium-, silicon-and cerium-containing starting materials with at least one antimony-, selenium-, iridium-and/or thorium-containing co-dopant by solid-state diffusion methods and subsequent thermal aftertreatment, which phosphor may comprise a alkali or alkaline-earth metal halide or a borate.

9. A process for the preparation of a phosphor having a garnet structure of formula I according to claim 1, comprising:

a) preparing a cerium-activated phosphor which is co-doped with antimony-, selenium-, iridium-and/or thorium-containing materials, by mixing at least 5 Y—, Al—, Tb—, Ce—, Lu—, Mg— and/or Si-containing starting materials,
b) thermal aftertreating of the antimony-, selenium-, iridium-and/or thorium-co-doped phosphor.

10. The process according to claim 9, further comprising coating the surface of the phosphor with nanoparticles of $SiO_2$, $TiO_2$, $Al_2O_3$, ZnO, $ZrO_2$ and/or $Y_2O_3$ or mixed oxides thereof or with nanoparticles of the phosphor composition with or without dopants.

11. The process according to claim 9, comprising providing the surface of the phosphor with a continuous coating of $SiO_2$, $TiO_2$, $Al_2O_3$, ZnO, $ZrO_2$ and/or $Y_2O_3$ or mixed oxides thereof and/or of the phosphor composition of the formula (I) without the activator cerium.

12. The process according to claim 9, comprising providing the surface of the phosphor with a porous coating of $SiO_2$, $TiO_2$, $Al_2O_3$, ZnO, $ZrO_2$ and/or $Y_2O_3$ or mixed oxides thereof or of the phosphor composition with or without Ce, Th, Ir, Sb and/or or Se dopants.

13. An illumination unit having at least one primary light source whose emission maximum is in the range 410 nm to 530 nm, where all or some of this radiation is converted into longer-wavelength radiation by a phosphor according to claim 1.

14. The illumination unit according to claim 13, wherein the light source is a luminescent indium aluminium gallium nitride.

15. The illumination unit according to claim 13, wherein the light source is a luminescent compound based on ZnO, TCO (transparent conducting oxide), ZnSe or SiC.

16. The illumination unit according to claim 13, wherein the light source is a material based on an organic light-emitting layer.

17. The illumination unit according to claim 13, wherein the light source is a source which exhibits electroluminescence and/or photoluminescence.

18. The illumination unit according to claim 13, wherein the light source is a plasma or discharge lamp.

19. The illumination unit according to claim 13, wherein the phosphor is arranged directly on the primary light source.

20. The illumination unit according to claim 13, wherein the optical coupling between the phosphor and the primary light source is achieved by a light-conducting arrangement.

21. A method comprising using at least one phosphor of the formula I according to claim 1 as conversion phosphor for conversion of all or some of the blue or near-UV emission from a luminescent diode.

22. A method comprising using at least one phosphor of the formula I according to claim 1 as conversion phosphor for conversion of the primary radiation into a certain color point by the color-on-demand concept.

23. The phosphor according to claim 6, wherein the functional groups are epoxy or silicone resin.

24. The illumination unit according to claim 14, wherein the light source is a luminescent indium aluminum gallium nitride of the formula $In_iGa_jAl_kN$, where $0 \leq i$, $0 \leq j$, $0 \leq k$, and $i+j+k=1$.

25. The illumination unit according to claim 13, wherein the phosphor is remote from the primary light source.

* * * * *

UNITED STATES PATENT AND TRADEMARK OFFICE
CERTIFICATE OF CORRECTION

PATENT NO. : 8,350,465 B2
APPLICATION NO. : 13/123758
DATED : January 8, 2013
INVENTOR(S) : Holger Winkler et al.

It is certified that error appears in the above-identified patent and that said Letters Patent is hereby corrected as shown below:

In the claims:

Column 14, Line 31 reads:

$(Y_{1-a-b-c}, Lu_a, Tb_b, Se_c)_{3-x} (Al_{5-y} Mg_{y/2} Si_{y/2}) O_{12} : Ce_x$      (IV)

Should read:

$(Y_{1-a-b-c}, Lu_a, Tb_b, Se_c)_{3-x} (Al_{5-y} Mg_{y/2} Si_{y/2}) O_{12} : Ce_x$      (IV) or

Signed and Sealed this
Twenty-third Day of April, 2013

Teresa Stanek Rea
*Acting Director of the United States Patent and Trademark Office*